United States Patent
Jarske

(10) Patent No.: US 7,321,911 B2
(45) Date of Patent: Jan. 22, 2008

(54) METHOD OF GENERATING SINUSOIDAL SIGNAL

(75) Inventor: Petri Jarske, Tampere (FI)

(73) Assignee: Nokia Corporation, Espoo (FI)

( * ) Notice: Subject to any disclaimer, the term of this patent is extended or adjusted under 35 U.S.C. 154(b) by 740 days.

(21) Appl. No.: 10/797,951

(22) Filed: Mar. 11, 2004

(65) Prior Publication Data

US 2004/0249874 A1    Dec. 9, 2004

(30) Foreign Application Priority Data

Mar. 14, 2003 (FI) .................................. 20030389

(51) Int. Cl.
*G06F 1/02* (2006.01)
(52) U.S. Cl. .................................................... 708/276
(58) Field of Classification Search ................ 708/276; 798/276
See application file for complete search history.

(56) References Cited

U.S. PATENT DOCUMENTS

| 4,110,567 A | 8/1978 | Boucher |
| 4,860,238 A | 8/1989 | Kraker |
| 5,701,393 A | 12/1997 | Smith, III et al. |
| RE36,388 E * | 11/1999 | Fox et al. ................ 708/276 |
| 6,014,682 A * | 1/2000 | Stephen et al. ............ 708/313 |
| 6,166,568 A | 12/2000 | Korsfeldt |

FOREIGN PATENT DOCUMENTS

WO    WO 01/41295 A1    6/2001

OTHER PUBLICATIONS

Al-lbrahim, M.M., "A Simple Recursive Digital Sinusoidal Oscillator with Uniform Frequency Spacing", The 2001 IEEE International Symposium on Circuits and Systems, Part 2, 2001, pp. 689-692.

* cited by examiner

*Primary Examiner*—D. H. Malzahn
(74) *Attorney, Agent, or Firm*—Hollingsworth & Funk, LLC

(57) ABSTRACT

Methods, devices and a software product for generating a sinusoidal signal of a desired frequency at a desired sampling rate. If the frequency is higher than the upper limit, a coefficient is determined as a function of the sampling rate and a sample of the first output sample sequence is determined as a linear combination of the coefficient and two previous output samples. The first output sample sequence is decimated by the sampling rate. If the frequency is lower than the lower limit, the coefficient is determined as a function of the sampling rate and the sample of the first output sample sequence is determined as a linear combination of the coefficient and two previous output samples. The first output sample sequence is multiplied so as to generate a second output sample sequence. The second output sample sequence is decimated by the sampling rate.

10 Claims, 3 Drawing Sheets

METHOD OF GENERATING SINUSOIDAL SIGNAL

FIELD OF THE INVENTION

The invention relates to digitally generating a sinusoidal signal, in particular to generating a sinusoidal signal by using real-number arithmetic and processing with multiple sampling frequencies.

BACKGROUND OF THE INVENTION

Digital sine-wave generators are commonly used for generating an oscillating sinusoidal signal in a variety of electronic applications. In mobile stations, for instance, digital sine-wave generators are typically used for generating simple ringing tones or DTMF (Dual-Tone-Multi-Frequency) tones among other things.

In accordance with the prior art, a sinusoidal signal can be generated digitally, for instance, by using a signal waveform stored in a lookup table. The method is commonly used in a plurality of electronic devices, such as mobile stations, in which sine-wave samples are stored in the tables. It is also possible to store in the tables other waveforms, such as tone samples. The method typically employs a counter to generate a table address, at which a desired tone sample can be found when needed. However, if there are a large number of stored samples, the tables may become very large, which requires that the memory capacity of the electronic device be large.

The size of the table can yet be minimized by storing in the table a sample, whose length is only one quarter of the wave length of the sinusoidal signal. By combining these quarters of the sinusoidal signal it is possible to generate various DTMF tones, for instance. In addition, it is possible to store coarse samples and to interpolate finer samples. Nevertheless, the problem remains that the memory capacity of the electronic device is used excessively. Currently, one major criterion for designing electronic devices, in particular, mobile stations, is to minimize the use of memory capacity.

A sinusoidal signal can also be generated digitally by using a prior art digital sine-wave oscillator. Typical sine-wave oscillators require at least one coefficient, i.e. for each sample there is at least one multiplication operation, which determines a frequency to be generated. Because the digital sine-wave oscillators typically have a predetermined, arithmetic total term length, the coefficient should be generally quantized, prior to generating the sinusoidal signal, to have a length that matches with space allocated to it. However, the quantization of the coefficient distorts the sinusoidal signal to be generated, which affects both the frequency and amplitude of the signal. Hence, it is generally difficult to generate precisely a frequency in the vicinity of a low frequency or a half sampling rate.

The effect of the quantization can be reduced by increasing filter bit widths so as to achieve sufficient performance. However, a problem arises that the method considerably increases computational complexity. In addition, bit width modifications and scalings generally restrict parameterization of a sinusoidal signal.

The publication "A Simple Recursive Digital Sinusoidal Oscillator with Uniform Frequency Spacing", The 2001 IEEE International Symposium on Circuits and Systems, Part:2, 2001, by M. M. Al-Ibrahim, pp. 689 to 692, presents a digital sine-wave oscillator used in telecommunications applications, which oscillator is arranged to generate sinusoidal signals, advantageously low-frequency sinusoidal signals with even frequency spacing. A problem with the sine-wave oscillator of the publication is, however, that it employs complicated complex number arithmetic for generating a sinusoidal signal. If an algorithm implementing the functionality according to the publication is executed with a digital signal processor DSP, for instance, it will be necessary to perform several command cycles for each output sample.

BRIEF DESCRIPTION OF THE INVENTION

It is an object of the invention to provide a procedure that allows reduction of the above-described problems. This is achieved with methods, devices and a software product.

The invention is based on determining a desired frequency f and a sampling rate $f_s$ for a sinusoidal signal to be generated. If the desired frequency f is higher than an upper limit frequency, advantageously higher than $0.375f_s$, a coefficient c is determined as a function of a multiple N of the sampling rate $f_s$, for instance such that the value of the coefficient c is given by the equation (1):

$$c = 2\cos\left(\frac{2\pi f}{Nf_s}\right) \qquad (1)$$

The $n^{th}$ sample of the first output sample sequence is determined as a linear combination of the coefficient c and two previous output samples. The output sample sequence is decimated by a multiple N of the sampling rate $f_s$ so as to generate a sinusoidal signal of the desired frequency f at a desired sampling rate $f_s$.

On the other hand, the invention is based on determining a desired frequency f and a sampling rate $f_s$ for a sinusoidal signal to be generated. If the desired frequency f is lower than a lower limit frequency, advantageously lower than $0.125f_s$, the coefficient c is determined as a function of a multiple N of the sampling rate $f_s$, for instance such that the value of the coefficient c is given by the equation (2):

$$c = 2\cos\left(\frac{1}{N}\left(\pi - \frac{f}{f_s}\right)\right) \qquad (2)$$

The $n^{th}$ sample of the first output sample sequence is determined as a linear combination of the coefficient c and two previous output samples. The first output sample sequence is multiplied by a fixed-frequency sine wave so as to generate a second output sample sequence. The second output sample sequence is decimated by a multiple N of the sampling rate $f_s$ so as to generate a sinusoidal signal of a desired frequency f at a desired sampling rate $f_s$.

According to a preferred embodiment the coefficient c is determined by means of a discrete frequency index, findex, such that the value of the frequency index, findex, substantially corresponds to the desired frequency f.

Considerable advantages are achieved with the arrangement of the invention. One advantage is that determination of an output sample is relatively simple, because the procedure employs real-number arithmetic instead of complicated complex-number arithmetic. A further advantage is that the procedure of the invention allows relatively precise generation of a sinusoidal signal of a desired frequency in the vicinity of a low frequency and a half sampling rate,

BRIEF DESCRIPTION OF THE DRAWINGS AND APPENDICES

In the following the invention will be described in greater detail in connection with embodiments, with reference to the attached drawings, in which FIG. 1 illustrates a prior art digital sine-wave oscillator;

DETAILED DESCRIPTION OF THE INVENTION

Digital sine-wave generators, such as digital sine-wave oscillators, are commonly used for generating an oscillating sinusoidal signal in a variety of electronic applications. In mobile stations, for instance, the digital sine-wave generators are typically used for generating simple ringing tones or DTMF tones among other things.

The operation of the sine-wave oscillators is generally based on feedback coupling, because an output signal is applied as feedback to an input of a circuit. When coupled, supply voltage produces a voltage pulse in the output signal. When the pulse is fed back to the input, it is typically amplified and re-coupled back to the input. Thus the coupling starts oscillating. The sine-wave oscillators include, for instance, RC oscillators, such as Wien bridge oscillators, and RC chain oscillators, LC oscillators and crystal oscillators. The invention and the embodiments thereof are not restricted to the presented oscillators, however, but the invention and its embodiments can also be applied to other sine-wave generators.

In connection with the present invention the sampling rate $f_s$ refers to how often the signal is sampled, i.e. how often the analogue signal is digitized. The quality of the digitized signal generally improves, as the sampling rate $f_s$ increases.

In the present document the preferred embodiments of the invention are described using a double sampling rate $2f_s$. However, the invention and its preferred embodiments are not restricted to the use of a double sampling rate $2f_s$, but the procedure according to the invention can also be implemented by using any multiple N of the sampling rate $f_s$. In that case the samples are decimated by the coefficient of the multiple N so as to generate a sinusoidal signal of a desired frequency f.

Figure 1:
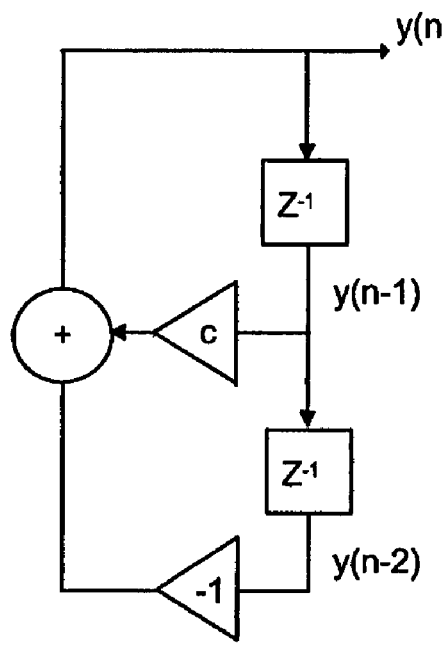

FIG. 1 is a block diagram of a typical digital sine-wave generator, in which the $n^{th}$ sample y(n) of the output sample sequence is a linear combination of two previous output samples, y(n−1) and y(n−2). This can be described by the following recursive difference equation (3):

$$y(n) = c \cdot y(n-1) - y(n-2) \tag{3}$$

where
n ≧ 0
y(n) = the $n^{th}$ sample of the output sample sequence
c = coefficient The coefficient c can be determined as a function of a desired frequency f and the sampling rate $f_s$, for instance by the following equation (4):

$$c = 2\cos\left(\frac{2\pi f}{f_s}\right) \tag{4}$$

The coefficient c is typically quantized in advance, because the length of the coefficient c must not exceed the length allocated to it in the digital sine-wave oscillator, the total term length of the oscillator arithmetic being predetermined. When the coefficient c is determined by the equation (4), there is problem that, due to the cosine function, the quantized coefficient c does not generally represent with high accuracy a frequency f that is very low as compared with the sampling rate $f_s$ or which is close to a half sampling rate $f_s/2$. However, the problem can be solved by frequency conversion, for instance, as a result of which it is possible to obtain a sinusoidal signal relatively precisely at the desired frequency f. The frequency conversion increases the complexity of the procedure, however.

On the other hand, it is also possible to generate sinusoidal signals, for instance, with complicated, arithmetic sine-wave generators by combining the output samples of e.g. two sine-wave generators, of which the first generator generates an adjustable frequency and the second generator generates a fixed frequency, whereby the generator generating the adjustable frequency can operate in a frequency range, where the quantized coefficient c may represent the frequency with higher accuracy.

The procedure of the invention is based, in part, on the latter procedure. However, the procedure of the invention is considerably simpler and therefore more readily applicable to various uses. The procedure of the invention utilizes real-number arithmetic and processing of a plurality of sampling rates in order to generate a sinusoidal signal having desired characteristics.

Figure 2:
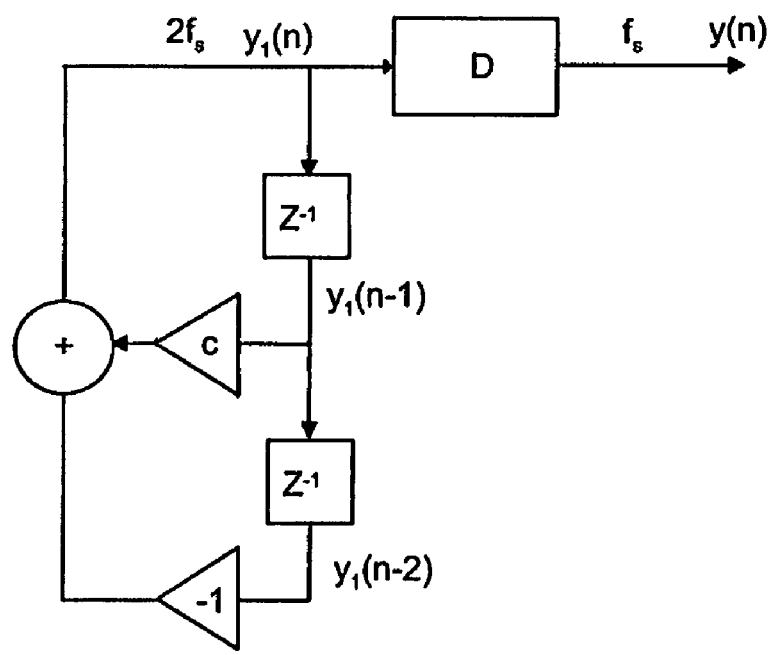
FIG. 2 illustrates a digital sine-wave oscillator for high frequencies in accordance with one preferred embodiment of the invention.

FIG. 2 is a block diagram of a digital sine-wave oscillator, by which it is possible to implement a method in accordance with a preferred embodiment, which is described next.

The method predetermines the desired frequency f and the sampling rate $f_s$ of the sinusoidal signal to be generated. In the present document a lower limit frequency refers to a frequency that is substantially $0.2f_s$ and an upper limit frequency refers to a frequency that is substantially $0.3f_s$. If the desired frequency f is higher than the upper limit frequency, advantageously higher than $0.375f_s$, a coefficient c is determined in the following manner. Because the sinusoidal signal is sampled at a double sampling rate $2f_s$, in order that the relation between the generated frequency f and the double sampling rate $2f_s$, i.e. the so-called upper sampling rate, would be within a range, where the frequencies can be represented relatively precisely with quantized arithmetic, the coefficient c is determined as a function of the generated frequency f and the sampling rate $f_s$ according to the equation (4) such that twice the sampling rate $2f_s$ is placed as the sampling rate $f_s$, whereby the equation (4) will have the form (1) of $$c = 2\cos\left(\frac{2\pi f}{Nf_s}\right) \tag{1}$$

where N represents a multiple of the sampling rate $f_s$. In this preferred embodiment N=2. The $n^{th}$ sample of the first output sample sequence $y_1(n)$ is generated as a linear combination of the coefficient c and two previous output samples $y_1(n-1)$ and $y_1(n-2)$. As described above, the sinusoidal signal is sampled at a higher sampling rate $2f_s$. The first output sample sequence $y_1$ that was sampled at the higher sampling rate $2f_s$ is decimated D by two, i.e. only every second sample will be taken for generating the sinusoidal signal of desired frequency at the desired sampling rate $f_s$.

Figure 3:
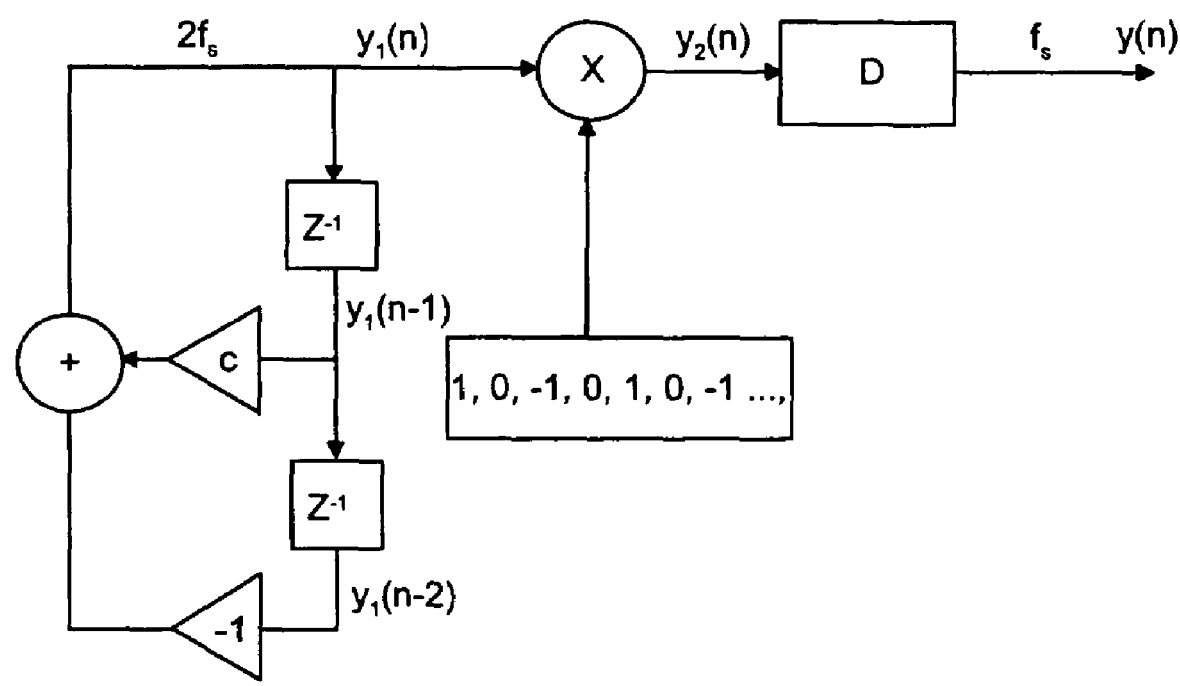
FIG. 3 illustrates a digital sine-wave oscillator for low frequencies in accordance with one preferred embodiment of the invention.

FIG. 3 shows a block diagram of a digital sine-wave oscillator that implements a method of an advantageous embodiment to be described next.

The method predetermines the desired frequency f and the sampling rate $f_s$ of the sinusoidal signal to be generated. If the desired frequency f is lower than the lower limit frequency, advantageously lower than $0.125f_s$, the coefficient c is determined in the following manner. Because the method first generates the sinusoidal signal to frequency $0.5f_s$-f and the sinusoidal signal is sampled at a double sampling rate $2f_s$, in order that the relation between the generated frequency f and the double sampling rate $2f_s$, i.e. the so-called upper sampling rate, would be within a range, where the frequencies can be represented relatively precisely with quantized arithmetic, the coefficient c is determined as a function of the generated frequency f and the sampling rate $f_s$ according to the equation (4) such that the frequency $0.5f_s$-f is placed as the frequency f, whereby the equation (4) will have the form (2) of $$c = 2\cos\left(\frac{1}{N}\left(\pi - \frac{f}{f_s}\right)\right) \quad (2)$$

The $n^{th}$ sample $y_1(n)$ of the first output sample sequence is generated to frequency $0.5f_s$-f as a linear combination of the coefficient c and two previous output samples $y_1(n-1)$ and $y_1(n-2)$. The frequency $0.5f_s$-f is close to a quarter of the upper sampling rate $2f_s$, when the desired frequency f is low. As described above, the sinusoidal signal is sampled at the double sampling rate $2f_s$, as a result of which the first generated output sample sequence $y_1$ is multiplied by a fixed-frequency sine wave, such as the sequence 1, 0, −1, 0, 1, 0, −1, which substantially corresponds to multiplication by another sinusoidal signal whose frequency is one quarter of the upper sampling rate, i.e. $f_s/2$. Due to the real-number arithmetic, multiplication of the first output sample sequence $y_1$ by this fixed-frequency sine wave produces two sine-wave components, i.e. the second output sample sequence $y_2$. The frequency of the first component is the desired frequency f and the frequency of the second component is the difference between the sampling rate $f_s$ and the desired frequency f, i.e. $f_s$-f. The second output sample sequence $y_2$ will be decimated D by two, whereby the second sine-wave component aliases to the desired frequency f, whereby one sinusoidal signal of the desired frequency f at the desired sampling rate $f_s$ will be obtained.

According to a preferred embodiment the coefficient c is determined by using a discrete frequency index, findex, whereby it is possible to avoid the calculation of the coefficient c in the sine-wave oscillator by the equation (4). The use of the frequency index, findex, is illustrated in the following example.

When the frequency index, findex, is an integer within the range of 0 to 65535, the prior art generation method of a sinusoidal signal, such as the sine-wave generator of FIG. 1, allows the generation of the following frequencies given by the equation (5) derived from the equation (5):

$$\frac{f}{f_s} = \frac{1}{2\pi}\arccos\left(\frac{32768 - findex}{32768}\right) \quad (5)$$

The parenthetical expression corresponds here to half the coefficient c, i.e. c/2.

The prior art generation method of the sinusoidal signal is advantageously used for generating sinusoidal signals, whose desired frequency f is within the frequency range of $0.125f_s$ to $0.375f_s$, whereby $16384 \leq findex \leq 49151$. Thus the relation between the desired frequency f and the sampling rate $f_s$ is within a range, where the coefficient c may represent relatively precisely the desired frequency f.

When the desired frequency f is higher than the upper limit frequency, advantageously higher than $0.375f_s$, whereby $49151 \leq findex \leq 65535$, the relation between the frequency f and the sampling frequency $f_s$ is obtained by deriving from the equation (4):

$$\frac{f}{f_s} = \frac{1}{\pi}\arccos\left(\frac{65535 - findex}{32768}\right) \quad (6)$$

However, if the desired frequency f is lower than the lower limit frequency, advantageously lower than $0.125f_s$, whereby $0 \leq findex \leq 16384$, the relation between the desired frequency f and the sampling rate $f_s$ is obtained by deriving from the equation (2):

$$\frac{f}{f_s} = \frac{1}{2} - \frac{1}{\pi}\arccos\left(\frac{findex}{32768}\right) \quad (7)$$

According to a preferred embodiment the sinusoidal signal generation functionality can also be implemented by an algorithm, which is typically coded into a software code with a programming language, such as C++. The software code can be executed, for instance, with a digital signal processor DSP or a micro controller unit MCU. The same arithmetic functionality can also be executed with a fixed logic, such as an ASIC circuit, for instance.

Figure 4:
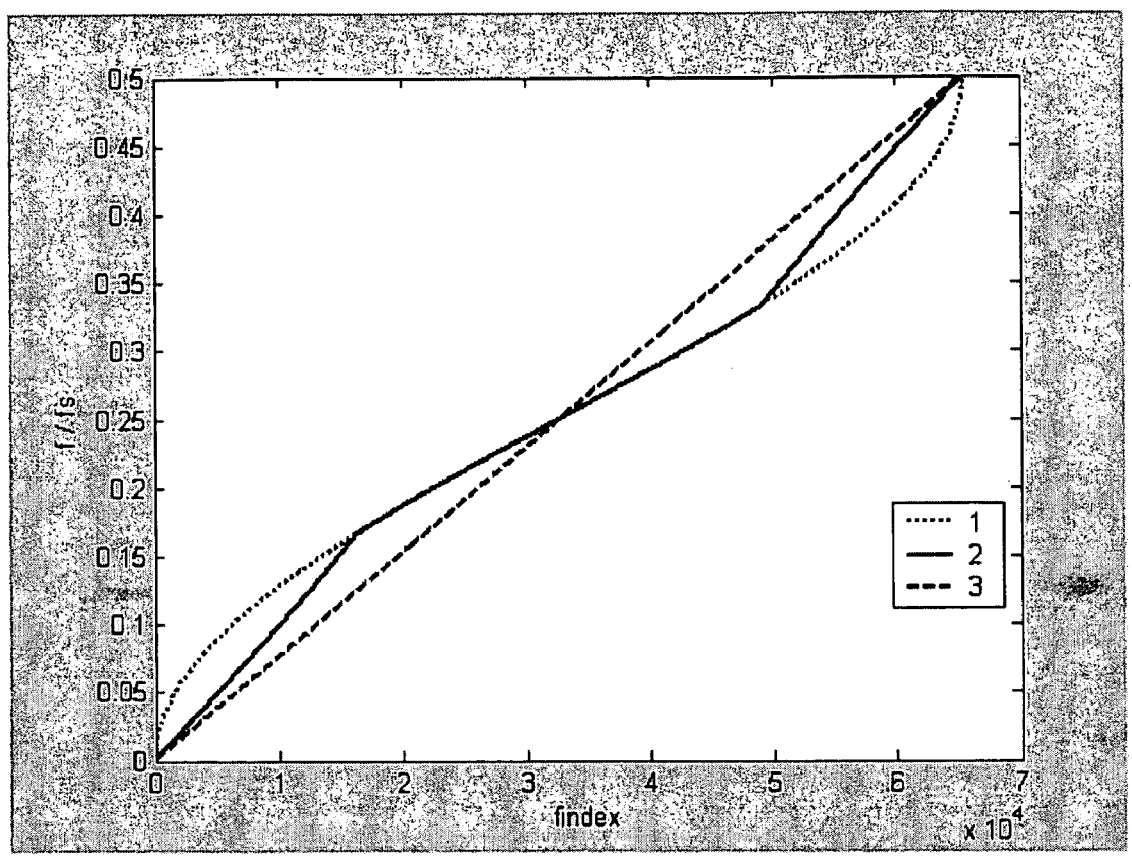
FIG. 4 shows the relation between frequencies generated by various methods as a function of frequency index.

The diagram of FIG. 4 illustrates the above-described embodiments. The curve 1 represents the relation of the frequencies generated by the prior art method and the curve 2 that of the frequencies generated by the above-described preferred embodiments as a function of the frequency index, findex. The curve 3 represents the relation of the frequencies as a function of the frequency index, findex, in an ideal case. When the results obtained by various methods are compared with the ideal curve, it can be noted that the methods of the preferred embodiments provide better results than the prior art sinusoidal signal generation method, if the generated frequency is lower than the lower limit frequency or higher than the upper limit frequency. The prior art generation method may, however, provide results that correspond to those obtained by the preferred embodiments, if the generated frequency is higher than or equal to the lower limit frequency, or lower than or equal to the upper limit frequency.

The above-described generation methods of the sinusoidal signal can be implemented by the sine-wave generators according to preferred embodiments of the invention.

According to one preferred embodiment, a sine-wave generator comprises means for determining the $n^{th}$ sample $y_1(n)$ of the first output sample sequence as a linear combination of said coefficient, c and two previous output samples $y_1(n-1)$ and $y_1(n-2)$. The sine-wave generator also comprises means for determining the relation between the desired frequency f and the sampling rate $f_s$, means for determining the coefficient c as a function of a multiple N of the sampling rate $f_s$, for instance, such that its value corresponds to the equation (1) presented above, and means for decimating the first output sample sequence $y_1(n)$ by the multiple N of the sampling rate $f_s$ for generating the sinusoidal signal of the desired frequency f at the desired sampling rate $f_s$ in response to the desired frequency f being higher than the upper limit frequency.

According to one preferred embodiment, a sine-wave generator comprises means for determining the $n^{th}$ sample $y_1(n)$ of the first output sample sequence as a linear combination of said coefficient c and two previous output samples $y_1(n-1)$ and $y_1(n-2)$. The sine-wave generator also comprises means for determining the relation between the desired frequency f and the sampling rate $f_s$, means for determining the coefficient c as a function of a multiple N of the sampling rate $f_s$, for instance, such that its value corresponds to the equation (2) presented above, means for multiplying the first output sample sequence $y_1$ by a fixed-frequency sine wave, such as the sequence 1, 0, -1, 0, 1, 0, -1, . . . , for generating a second output sample sequence $y_2$, and means for decimating the second output sample sequence $Y_2$ by the multiple of the sampling rate $f_s$ so as to generate the sinusoidal signal of the desired frequency f at the desired sampling rate $f_s$ in response to the desired frequency f being lower than the lower limit frequency.

According to one preferred embodiment, a sine-wave oscillator comprises means for determining the $n^{th}$ sample $y_1(n)$ of the first output sample sequence as a linear combination of the coefficient c and two previous output samples $y_1(n-1)$ and $y_1(n-2)$. The sine-wave oscillator also comprises means for determining the relation between the desired frequency f and the sampling rate $f_s$, means for determining the coefficient c as a function of a multiple N of the sampling rate $f_s$, for instance, such that its value corresponds to the equation (1) presented above, and means for decimating the first output sample sequence $y_1$ by the multiple N of the sampling rate $f_s$ for generating the sinusoidal signal of the desired frequency f at the desired sampling rate $f_s$ in response to the desired frequency f being higher than the higher limit frequency. The sine-wave oscillator also comprises means for determining the coefficient c as a function of the sampling rate $f_s$, for instance, such that its value corresponds to the equation (2) presented above, means for multiplying the first output sample sequence $y_1$ by a fixed-frequency sine wave, such as the sequence 1, 0, -1, 0, 1, 0, -1, . . . , so as to generate a second output sample sequence $Y_2$, and means for decimating the second output sample sequence $y_2$ by the multiple N of the sampling rate $f_s$ so as to generate the sinusoidal signal of the desired frequency f at the desired sampling rate $f_s$ in response to the desired frequency f being lower than the lower limit frequency. The sine-wave oscillator also comprises means for determining the coefficient c as a function of the sampling rate $f_s$, for instance, such that its value corresponds to the equation (4) presented above, so as to generate the sinusoidal signal of the desired frequency f at the desired sampling rate $f_s$ in response to the desired frequency f being higher than or equal to the lower limit frequency or lower than or equal to the upper limit frequency.

It is also possible to provide the generation functionality of the sinusoidal signal by a software product that can be arranged in an electronic device.

According to one preferred embodiment, the software product comprises a program code for determining the $n^{th}$ sample $y_1(n)$ of the first output sample sequence as a linear combination of the coefficient c and two previous output samples $y_1(n-1)$ and $y_1(n-2)$, and a program code for determining the desired frequency f and the sampling rate $f_s$. The software product also comprises a first sub-process in response to the desired frequency f being higher than the upper limit frequency. The first sub-process comprises a program code for determining the coefficient c as a function of a multiple of the sampling rate $f_s$, for instance, such that its value corresponds to the equation (1) presented above, and a program code for decimating the first output sample sequence $y_1$ by the multiple N of the sampling rate $f_s$ at the desired sampling rate $f_s$. The software product also comprises a second sub-process in response to the desired frequency f being lower than the lower limit frequency. The second sub-process comprises a program code for determining the coefficient c as a function of the multiple N of the sampling rate $f_2$, for instance, such that its value corresponds to the equation (2) presented above, a program code for multiplying the first output sample sequence $y_1$ by a fixed-frequency sine wave, such as the sequence 1, 0, -1, 0, 1, 0, -1, . . . , so as to generate the second output sample sequence $y_2$ and a program code for decimating the second output sample sequence $y_2$ by the multiple N of the sampling rate $f_s$ so as to generate the sinusoidal signal of the desired frequency f at the desired sampling rate $f_s$. The software product also comprises a third sub-process in response to the desired frequency f being higher than or equal to the lower limit frequency or lower than or equal to the upper limit frequency. The third sub-process comprises a program code for determining the coefficient c as a function of the multiple N of the sampling rate $f_s$, for instance, such that its value corresponds to the equation (4) presented above so as to generate the sinusoidal signal of the desired frequency f at the desired sampling rate $f_s$.

It is apparent to a person skilled in the art that as technology progresses, the basic idea of the invention can be implemented in a variety of ways. Thus the invention and its preferred embodiments are not restricted to the above-described examples and components, but they may vary within the scope of the claims.

The invention claimed is:

1. A method for generating a sinusoidal signal, the method comprising:
   determining for said sinusoidal signal a desired frequency and a sampling rate, the desired frequency being higher than an upper limit frequency;
   determining the $n^{th}$ sample of the first output sample sequence as a linear combination of a coefficient and two previous output samples;
   determining the coefficient as a function of a multiple of said sampling rate, wherein the multiple is not equal to one; and
   decimating the first output sample sequence by the multiple of the sampling rate so as to generate the sinusoidal signal of the desired frequency at the desired sampling rate.

2. A method as claimed in claim 1, the method further comprising:
   determining the coefficient by means of a discrete frequency index, the value of the frequency index substantially corresponding to the desired frequency.

3. A method for generating a sinusoidal signal, the method comprising:
   determining for the sinusoidal signal a desired frequency and a sampling rate;
   determining the $n^{th}$ sample of the first output sample sequence as a linear combination of a coefficient and two previous output samples;
   determining the coefficient as a function of a multiple of said sampling rate;
   multiplying said first output sample sequence by a fixed-frequency sine wave so as to generate a second output sample sequence; and
   decimating the second output sample sequence by the multiple of the sampling rate so as to generate the sinusoidal signal of the desired frequency at the desired sampling rate, if the desired frequency is lower than a lower limit frequency.

4. A method as claimed in claim 3, the method further comprising:
   determining the coefficient by means of a discrete frequency index, the value of the frequency index substantially corresponding to the desired frequency.

5. A sine-wave oscillator, which is configured to generate a sinusoidal signal of a desired frequency at a sampling rate, when the desired frequency is higher than a predetermined upper limit frequency, and which sine-wave oscillator comprises:
   means for determining the $n^{th}$ sample of the first output sample sequence as a linear combination of the coefficient and two previous output samples;
   means for determining the relation between the desired frequency and the sampling rate;
   means for determining the coefficient as a function of the multiple of said sampling rate; and
   means for decimating the first output sample sequence so as to generate the sinusoidal signal of the desired frequency at the desired sampling rate.

6. A sine-wave oscillator, which is configured to generate a sinusoidal signal of a desired frequency at a sampling rate, when the desired frequency is lower than a predetermined lower limit frequency, and which sine-wave oscillator comprises:
   means for determining the $n^{th}$ sample of the first output sample sequence as a linear combination of the coefficient and two previous output samples;
   means for determining the relation between the desired frequency and the sampling rate;
   means for determining the coefficient as a function of the multiple of said sampling rate;
   means for multiplying the first output sample sequence by a fixed-frequency sine wave so as to generate a second output sample sequence; and
   means for decimating said second output sample sequence by said multiple of the sampling rate so as to generate the sinusoidal signal at the desired sampling rate.

7. A sine-wave oscillator, which is configured to generate a sinusoidal signal of a desired frequency at a sampling rate and which sine-wave oscillator comprises:
   means for determining the $n^{th}$ sample of the first output sample sequence as a linear combination of the coefficient and two previous output samples; and a first group of means in response to the desired frequency is higher than a predetermined upper limit frequency, the first group comprising:
   means for determining the relation between the desired frequency and the sampling rate;
   means for determining the coefficient as a function of the multiple of said sampling rate; and
   means for decimating the first output sample sequence by said multiple of the sampling rate so as to generate the sinusoidal signal of the desired frequency at the desired sampling rate;
   a second group of means in response to the desired frequency is lower than a predetermined lower limit frequency, the second group comprising:
   means for determining the coefficient as a function of the multiple of said sampling rate;
   means for multiplying the first output sample sequence by a fixed-frequency sine wave so as to generate a second output sample sequence; and
   means for decimating said second output sample sequence by said multiple of the sampling rate so as to generate the sinusoidal signal at the desired sampling rate; and
   a third group of means in response to the desired frequency is higher than or equal to a predetermined lower limit frequency or lower than or equal to a predetermined higher limit frequency, the third group comprising:
   means for determining the coefficient as a function of said sampling rate so as to generate the sinusoidal signal of the desired frequency at the desired sampling rate.

8. A software product stored on a computer readable medium including computer-executable instructions for generating a sinusoidal signal of a desired frequency at a sampling rate, which software product comprises:
   a program code for determining the $n^{th}$ sample of the first output sample sequence as a linear combination of the coefficient and two previous output samples;
   a program code for determining the relation between the desired frequency and the sampling rate; and
   a first sub-process in response to the desired frequency being higher than the upper limit frequency, the first sub-process comprising:
   a program code for determining the coefficient as a function of the multiple of said sampling rate; and
   a program code for decimating the first output sample sequence by said multiple of the sampling rate so as to generate the sinusoidal signal of the desired frequency at the desired sampling rate;
   a second sub-process in response to the desired frequency being lower than the lower limit frequency, the second sub-process comprising:
   a program code for determining the coefficient as a function of the multiple of said sampling rate;
   a program code for multiplying the first output sample sequence by a fixed-frequency sine wave so as to generate a second output sample sequence; and
   a program code for decimating said second output sample sequence by said multiple of the sampling rate so as to generate the sinusoidal signal of the desired frequency at the desired sampling rate; and a third sub-process in response to the desired frequency being higher than or equal to the lower limit frequency or lower than or equal to the upper limit frequency, the third sub-process comprising:
a program code for determining the coefficient as a function of said sampling rate so as to generate the sinusoidal signal of the desired frequency at the desired sampling rate.

9. A sine-wave oscillator configured to generate a sinusoidal signal of a desired frequency at a sampling rate when the desired frequency is higher than a predetermined upper limit frequency, the sine-wave oscillator further configured to:
determine the $n^{th}$ sample of a first output sample sequence as a linear combination of a coefficient and two previous output samples;
determine the relation between the desired frequency and the sampling rate;
determine the coefficient as a function of a multiple of said sampling rate; and
decimate the first output sample sequence so as to generate the sinusoidal signal of the desired frequency at the desired sampling rate.

10. A sine-wave oscillator configured to generate a sinusoidal signal of a desired frequency at a sampling rate when the desired frequency is lower than a predetermined lower limit frequency, the sine-wave oscillator further configured to:
determine the $n^{th}$ sample of a first output sample sequence as a linear combination of a coefficient and two previous output samples;
determine the relation between the desired frequency and the sampling rate;
determine the coefficient as a function of a multiple of said sampling rate;
multiply the first output sample sequence by a fixed-frequency sine wave so as to generate a second output sample sequence; and
decimate said second output sample sequence by said multiple of the sampling rate so as to generate the sinusoidal signal at the desired sampling rate.

* * * * *

UNITED STATES PATENT AND TRADEMARK OFFICE
CERTIFICATE OF CORRECTION

PATENT NO. : 7,321,911 B2  Page 1 of 1
APPLICATION NO. : 10/797951
DATED : January 22, 2008
INVENTOR(S) : Jarske It is certified that error appears in the above-identified patent and that said Letters Patent is hereby corrected as shown below:

In the Specification:

Col. 1, line 65: "M. M. AI-Ibrahim" should read --M. M. Al-Ibrahim--.

Col. 6, line 22: "frequency f, is" should read --frequency $f_s$ is--.

Col. 7, line 33: "sequence $Y_2$" should read --sequence $y_2$--.

Col. 7, line 58: "sequence $Y_2$" should read --sequence $y_2$--.

Signed and Sealed this

Twentieth Day of May, 2008

JON W. DUDAS
*Director of the United States Patent and Trademark Office*